United States Patent [19]

Yu et al.

[11] Patent Number: 5,811,345
[45] Date of Patent: Sep. 22, 1998

[54] PLANARIZATION OF SHALLOW- TRENCH-ISOLATION WITHOUT CHEMICAL MECHANICAL POLISHING

[75] Inventors: Chen-Hua Yu, Keelung; Syun-Ming Jang Jang, Hsinchu, both of Taiwan

[73] Assignee: Taiwan Semiconductor Manufacturing Co., Ltd., Hsinchu, Taiwan

[21] Appl. No.: 932,895

[22] Filed: Sep. 18, 1997

[51] Int. Cl.$^6$ ..................................................... H01L 21/76
[52] U.S. Cl. ......................... 438/424; 438/784; 438/735; 438/924; 438/916; 438/750; 438/697
[58] Field of Search ................................... 438/424, 692, 438/693, 697, 705, 759, 784, 916, 924, 227, 128, 255, 750

[56] References Cited

U.S. PATENT DOCUMENTS

| | | |
|---|---|---|
| 3,892,608 | 7/1975 | Kuhn . |
| 4,507,849 | 4/1985 | Shinozaki . |
| 5,314,843 | 5/1994 | Yu et al. . |
| 5,498,565 | 3/1996 | Gocho et al. . |
| 5,578,518 | 11/1996 | Kioke et al. . |
| 5,665,635 | 9/1997 | Kwon et al. . |

*Primary Examiner*—George R. Pourson
*Attorney, Agent, or Firm*—Merchant, Gould, Smith, Edell, Welter & Schmidt

[57] ABSTRACT

A new method for planarization of shallow trench isolation is disclosed by the wet etching and plasma etching, due to the surface sensitivity of SACVD $O_3$-TEOS that depends on substrate. The method described herein includes a pad oxide layer, a silicon nitride layer, and a doped polysilicon oxide layer formed on a silicon substrate. A shallow trench is formed by photolithography and dry etching process to etch the doped polysilicon oxide layer, the silicon nitride layer, the pad oxide layer, and the silicon substrate. A SACVD $O_3$-TEOS layer is subsequently formed on the on the doped polysilicon oxide layer and filling into the trench, the deposition rate of the ozone-TEOS layer on the doped polysilicon oxide layer is slower than the deposition rate of the ozone-TEOS layer on the silicon wafer, the wet etching rate of the ozone-TEOS layer on the doped polysilicon oxide layer is faster than the etching rate of the ozone-TEOS layer on the silicon wafer. A wet etching is performed to planarize the ozone-TEOS layer.

16 Claims, 5 Drawing Sheets

PLANARIZATION OF SHALLOW- TRENCH- ISOLATION WITHOUT CHEMICAL MECHANICAL POLISHING

FIELD OF THE INVENTION

The present invention relates to a method of isolation for integration circuits (IC), and more especially, to a method of self-planarization for the shallow trench isolation without chemical mechanical polishing.

BACKGROUND OF THE INVENTION

To manufacture electric circuits involves connecting isolated devices through specific conducting paths. Conventionally, devices isolated from one another must first be formed in the silicon substrate. Then they are interconnected to form some desired circuit function. It is a complicated and challenging task to establish an effective isolation in submicron ICs in the face of decreased isolation in ULSI or VLSI.

At present, many of isolation technologies have been proposed such as LOCOS(LOCal Oxidation of Silicon), shallow trench isolation(STI) and so on. The most widely used method for generating the isolation is the LOCOS structure. The LOCOS involves the formation of Field OXides(FOX) in the non-active regions of the substrate. As device geometry reaches submircon size, conventional LOCOS isolation has a limitation. For example, the bird's beaks structure and shape causes unacceptably large encroachment of the field oxide into the device active regions. Further, the topography of the LOCOS is inadequate for submicron devices.

Trench isolation is used primarily for isolating devices in VLSI and ULSI, and hence they can be considered as replacement for conventional LOCOS isolation. Further, shallow trench isolation is gaining popularity for quartermicron technology. In the basic shallow trench isolation (STI) technology, shallow trenches are anisotropically etched into the silicon substrate. Next, a CVD oxide is deposited onto the substrate and is then be planarized by CMP(Chemical Mechanical Polishing) or etching back.

Unfortunately, the planarization of shallow trench isolation relied on chemical mechanical polishing(CMP) which has been proven with some disadvantages such as, polish rate variation of large versus small feature so a reverse-tone mask is added, and the deposition rate of SACVD $O_3$-TEOS depends on the substrate material. As shown in FIG. 1, on a silicon substrate 1, the challenges association with CMP for STI include dishing of wide trench 3, erosion of small nitride, and oxide remaining on large nitride. The dishing degrades the planarity of a layer. The area denoted by 2 is used for isolated device, silicon nitride may be erode the area, completely. This will damage the silicon substrate and devices that are fabricated here. The oxide 4 that remain on the silicon nitride later makes wet strip of silicon nitride unlikely.

The conventional method to solve above described problems will be described as followed. Referring to FIG. 2, a silicon dioxide layer 3 is formed on a substrate 1 for using as a pad layer. The thickness of the silicon dioxide layer is about 110 angstroms. Then, a silicon nitride layer 5 is deposited on the pad layer 3 to have a thickness about 1700 angstroms.

Still referring to FIG. 2, a photoesist is patterned on the silicon nitride layer 7 to define non-active regions. Then, shallow trenches are created by using dry etching. The photoresist is subsequently stripped away while the shallow trenches are formed.

Referring to FIG. 3, a silicon oxide layer 9 is deposited on the silicon nitride layer 7 and is refilled into the shallow trenches for using as an isolation. Generally speaking, the thickness of the silicon oxide layer 9 is about 6000 to 8000 angstroms. Then, a photoresist 11 is patterned exact over the trenches on the silicon oxide layer 9.

Next turning to FIG. 4, a dry etching is used to etch a portion of the silicon oxide layer 9 using the photoresist layer 11 as a mask. Then, the photoresist 11 is removed away. A plurality of protruded portion 9a of the silicon oxide layer 9 are generated after the etching. The protruded portion 9a can eliminate the dishing problem. it is because that the removing rate of the CMP performed over the trench is faster than the neighboring regions. Then, a chemical mechanical polishing(CMP) technology is performed for planarization to the surface of the silicon nitride layer 9.

By using the conventional method can improved the result of the CMP planarization. However, the conventional method needs a photomasking. The throughput and yield will decrease by using the conventional method. Therefore, no additional mask method is need for polishing trench oxide is one of the path to solve the problems described above.

SUMMARY OF THE INVENTION

A new self-planarized shallow-trench-isolation process is proposed here. The method described herein includes a pad oxide layer, a silicon nitride layer ,and a doped polysilicon layer formed on a silicon substrate. Then, the doped polysilicon has to be oxidized.

Next, a shallow trench is formed by photolithography and dry etching process to etch the doped polysilicon layer, the silicon nitride layer, the pad oxide layer, and the silicon substrate. A SACVD $O_3$-TEOS layer is subsequently formed on the on the doped polysilicon oxide layer and filling into the trench, the deposition rate of the ozone-TEOS layer on the doped polysilicon oxide layer is slower than the deposition rate of the ozone-TEOS layer on the silicon wafer, the wet etching rate of the ozone-TEOS layer on the doped polysilicon oxide layer is faster than the etching rate of the ozone-TEOS layer on the silicon wafer.

Subsequently, a wet dip in HF solution is done after ozone-TEOS deposition. The slower deposition and the differential etching of the ozone-TEOS on the top of the doped polysilicon layer will planarize the ozone-TEOS surface.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of isolation for integration circuits (IC), and more especially, to a method of planarization for the shallow trench isolation without chemical mechanical polishing. The detail processes will be described as follows.

Figure 1:
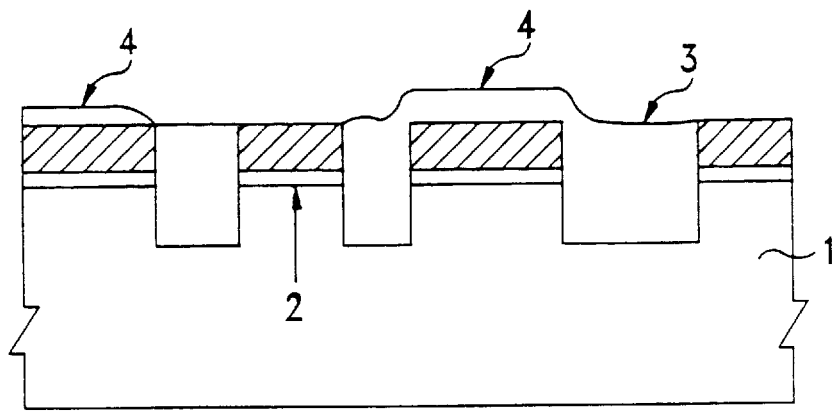
FIG. 1 is a cross section view of a semiconductor wafer illustrating the dishing problem on a substrate in accordance with the prior art.
Figure 2:
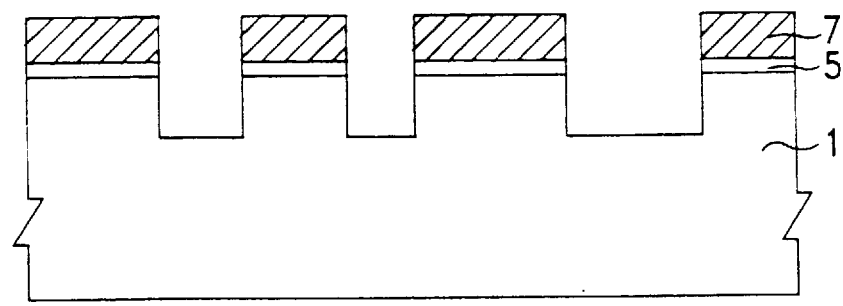
FIG. 2 is a cross section view of a semiconductor wafer illustrating the step of forming shallow trenches in the substrate in accordance with the prior art.
Figure 3:
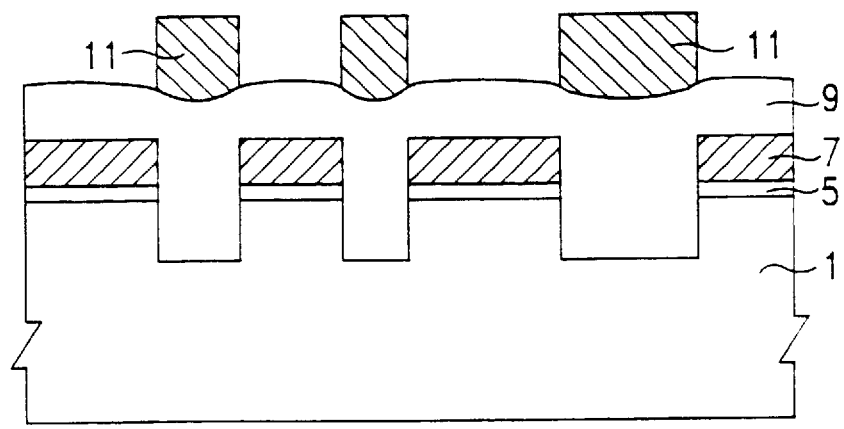
FIG. 3 is cross section view of a semiconductor wafer illustrating the step of forming a silicon oxide layer in the shallow trenches in accordance with the prior art.
Figure 4:
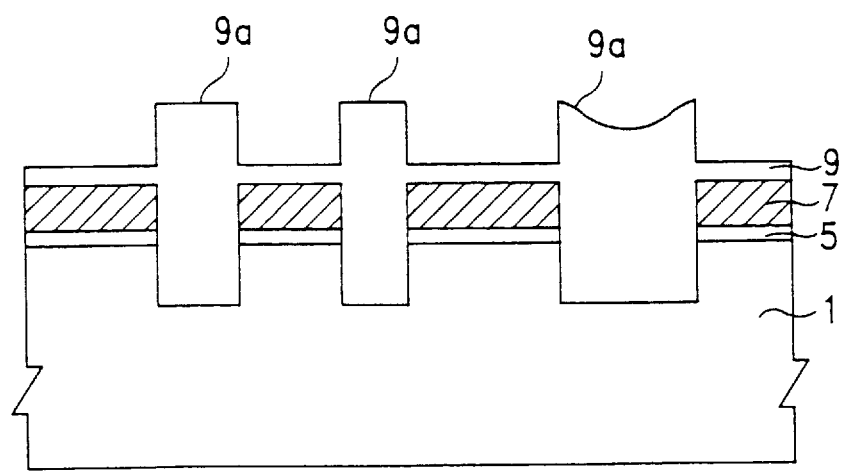
FIG. 4 is a cross section view of a semiconductor wafer illustrating the step of pattering and etching the silicon oxide layer in accordance with the prior art.
Figure 5:
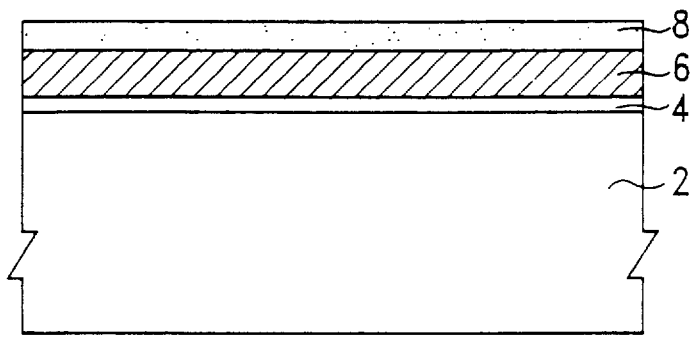
FIG. 5 is a cross section view of a semiconductor wafer illustrating the step of forming a pad oxide layer, a silicon nitride layer, and a doped polysilicon layer on a substrate in accordance with the present invention.

Referring to FIG. 5, a silicon substrate 2 can be p type or n type. An oxide layer 4 is formed on the silicon substrate 2 as a pad layer. The silicon dioxide layer is typically formed by thermal oxidation. In this embodiment, the thickness of the silicon dioxide 4 is about 90 to 130 angstroms. Subsequently, a silicon nitride layer 6 is deposited on the pad oxide layer 4 to serve as a pad nitride layer for subsequent process. The thickness of the silicon nitride layer 6 is about 1500 to 1700 angstroms. Next, an in-situ doped polysilicon layer 8 is deposited on the pad nitride layer 6 by low pressure chemical vapor deposition (LPCVD), the thickness of the doped polysilicon layer 8 is about 500 to 1000 angstroms, the dosage is at a range of 2.5 to 4.5 P(Phosphrous) %, and further the temperature to form the doped polysilicon layer is at a range of 600° to 800° C.

The doped polysilicon layer 8 is oxidized by using a thermal annealing in oxygen ambient after its deposition so that the STI(Shallow Trench Isolation) etching can be done easier. The temperature of thermal annealing is about 900° to 1100° C. for about 60 to 120 minute. This step is optional, and this step will convert the doped polysilicon layer into doped oxide layer or doped poly/oxide composition layer, depending on the time of oxidation.

Figure 6:
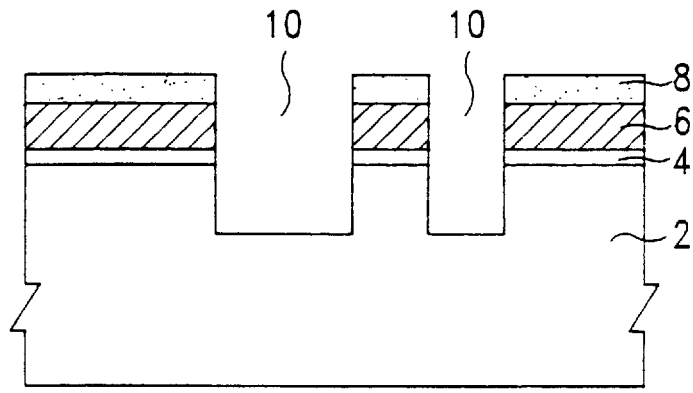
FIG. 6 is a cross section view of a semiconductor wafer illustrating the step of forming shallow trenches in the substrate in accordance to the present invention.

Turning to FIG. 6, a photoresist layer is patterned on the doped polysilicon oxide layer 8 (or doped oxide layer) to define the isolation regions, shallow trenches 10 are subsequently generated by using a dry etching technique. The doped polysilicon oxide layer 8 (or doped oxide layer), the pad nitride layer 8, the pad oxide layer 4, and the silicon substrate 2 can respectively be etched away by controlling the recipe. Typically the depth of the shallow trenches 10 are about 6000 to 8000 angstroms from the surface of the doped polysilicon oxide layer 8. The photoresist layer is then stripped away.

Figure 7:
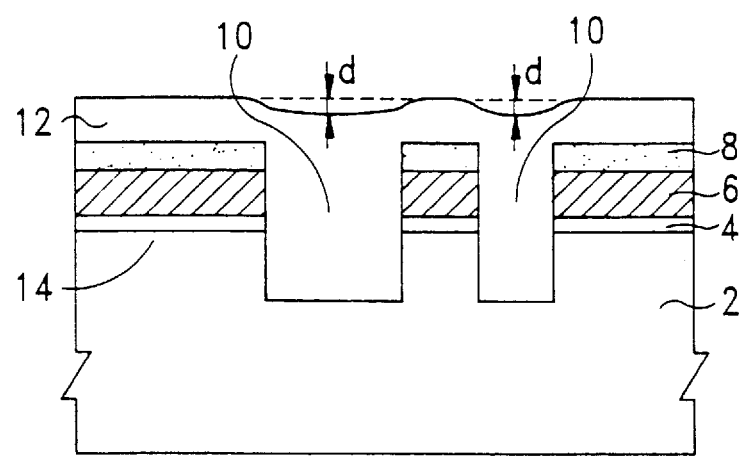
FIG. 7 is a cross section view of a semiconductor wafer illustrating the step of forming a $O_3$-TEOS in the shallow trenches and on the doped polysilicon layer accordance with the present invention.

Referring to FIG. 7, an ozone-TEOS layer 12 is deposited on the doped polysilicon layer 8 and refilled into the trenches 10 by using Sub-atmospheric CVD(SACVD). The deposition rate of SACVD ozone-TEOS depends on the substrate material(surface sensitive). The deposition rate of SACVD ozone-TEOS on the surface of silicon substrate 2 is faster relevant to its deposition rate on the surface of doped polysilicon 8. In the present invention, the deposition rate of SACVD ozone-TEOS on the surface of silicon substrate 2 is about 1500 to 2000 Å/minute, and the deposition rate of SACVD ozone-TEOS on the surface of polysilicon oxide 8 is about 100 to 150 Å/minute (if instead by doped oxide layer is about 100 to 150 Å/minute). Due to the character that described above, the height difference d measured from the surface of doped polysilicon layer between non-active region and active region 14 is smaller than the conventional STI process. Further, the character that describe is also sensitive to the doping dosage of the doped polysilicon layer, and the thickness of the doped polysilicon layer depends on the concentration of dosage. The more concentration, the thinner of the doped polysilicon layer is. So the recipe of process is more adjustable than conventional material.

In addition, the wet etching rate of the SACVD ozone-TEOS layer 12 formed on the doped doped oxide layer 8 is faster than that is formed on the silicon substrate 2. The wet etching rate of the SACVD ozone-TEOS layer 12 formed on the doped polysilicon oxide layer 8 is about 2300 to 3000 Å/minute (if instead by the doped oxide layer is about 2300 to 3000 Å/minute), the SACVD ozone-TEOS layer 12 formed on the silicon substrate 2 having wet etching rate is about 280 to 320 Å/minute.

Figure 8:
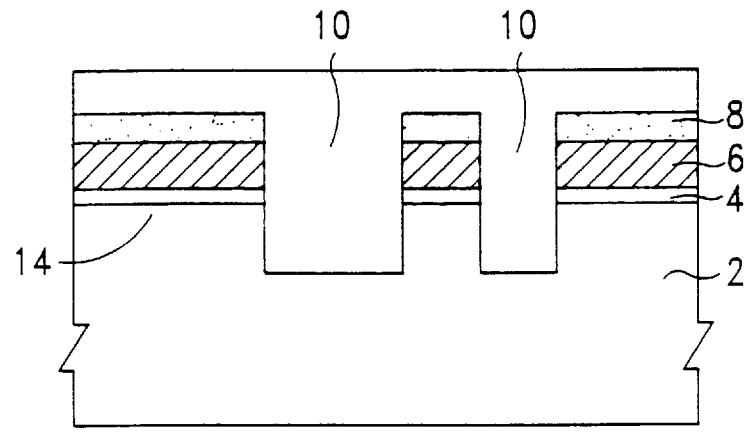
FIG. 8 is the cross section views of a semiconductor wafer illustrating the step of performing a wet etching process on the $O_3$-TEOS layer in accordance with the present invention.

Referring to FIG. 8, a wet dip in HF solution is performed to lower the ozone-TEOS 12 on the top of the active area 14 to further planarize the SACVD ozone-TEOS. So we can enhanced planarization of the SACVD ozone-TEOS layer 12 due to the deposition rate and etching rate differential of the SACVD ozone-TEOS on active area 14 and non-active area.

Figure 9:
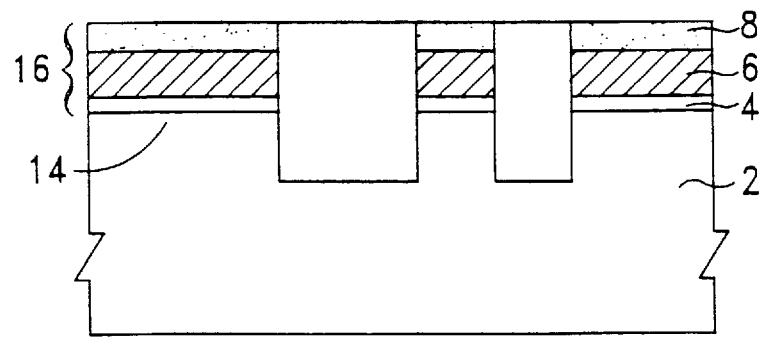
FIG. 9 is a cross section view of a semiconductor wafer illustrating the step of performing a dry etching to the remaining $O_3$-TEOS layer in accordance with the present invention.

Referring to FIG. 9, subsequently, a plasma etching is performed to remove the remaining oxide (ozone-TEOS) 12 on the top of pad stack(active area).

The present invention provide a new STI process without reverse tone mask and chemical mechanical polishing (CMP), the yield will improve, and save the cost of manufacturing devices.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, the doped polysilicon layer can instead by PE-PSG(Plasma-Enhanced PSG). In this prefer embodiment, the deposition rate of SACVD ozone-TEOS on the surface of silicon substrate 2 is about 1500 to 2000 Å/minute, and the deposition rate of SACVD ozone-TEOS on the surface of PE-PSG 8 is about 90 to 130 Å/minute. The wet etching rate of the SACVD ozone-TEOS layer 12 formed on the PE-PSG layer 8 is about 2000 to 2500 Å/minute, the SACVD ozone-TEOS layer 12 formed on the silicon substrate 2 having wet etching rate is about 280 to 320 Å/minute.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a shallow trench isolation on a silicon wafer, said method comprising the steps of:

forming a pad oxide layer on said wafer;

forming a silicon nitride layer on said pad layer;

forming a doped polysilicon layer on said silicon nitride layer;

performing a thermal annealing for converting said doped polysilicon layer into a doped polysilicon oxide layer;

forming a trench by etching said doped polysilicon oxide layer, said silicon nitride layer, said pad oxide layer, and said silicon wafer;

forming a ozone-TEOS layer for isolation on said doped polysilicon oxide layer and filling into said trench, the deposition rate of said ozone-TEOS layer on said doped polysilicon oxide layer is slower than the deposition rate of said ozone-TEOS layer on said silicon wafer, the wet etching rate of said ozone-TEOS layer on said doped polysilicon oxide layer is faster than the etching rate of said ozone-TEOS layer on said silicon wafer; and performing a wet etching to etch said ozone-TEOS layer.

2. The method of claim 1, wherein said ozone-TEOS layer is formed by sub-atmospheric CVD.

3. The method of claim 1, wherein said the deposition rate of said ozone-TEOS layer on said silicon wafer is about 1500 to 2000 angstroms/minute.

4. The method of claim 1, wherein said the deposition rate of said ozone-TEOS layer on said doped-polysilicon oxide layer is about 100 to 150 angstroms/minute.

5. The method of claim 1, wherein said the wet etching rate of said ozone-TEOS layer on said doped polysilicon oxide layer is about 2000 to 3000 angstroms/minute.

6. The method of claim 1, wherein said the wet etching rate of said ozone-TEOS layer on said silicon wafer is about 280 to 320 angstroms/minute.

7. The method of claim 1, wherein the etchant of said wet etching is HF solution.

8. The method of claim 1, further comprising:

performing a plasma etching to remove the remaining said ozone-TEOS layer after performing said wet etching.

9. A method for forming a shallow trench isolation on a silicon wafer, said method comprising the steps of:

forming a pad oxide layer on said wafer;

forming a silicon nitride layer on said pad layer;

forming a plasma-enhanced PSG layer on said silicon nitride layer;

forming a trench by etching said plasma-enhanced PSG layer, said silicon nitride layer, said pad oxide layer, and said silicon wafer;

forming a ozone-TEOS layer for isolation on said plasma-enhanced PSG layer and filling into said trench, the deposition rate of said ozone-TEOS layer on said plasma-enhanced PSG layer is slower than the deposition rate of said ozone-TEOS layer on said silicon wafer, the etching rate of said ozone-TEOS layer on said plasma-enhanced PSG layer is faster than the etching rate of said ozone-TEOS layer on said silicon wafer; and performing a wet etching process to etch said ozone-TEOS layer.

10. The method of claim 9, wherein said ozone-TEOS layer is formed by sub-atmospheric CVD.

11. The method of claim 9, wherein said the deposition rate of said ozone-TEOS layer on said silicon wafer is about 1500 to 2000 angstroms/minute.

12. The method of claim 9, wherein said the deposition rate of said ozone-TEOS layer on said plasma-enhanced PSG layer is about 90 to 130 angstroms/minute.

13. The method of claim 9, wherein said the wet etching rate of said ozone-TEOS layer on said silicon wafer is about 280 to 320 angstroms/minute.

14. The method of claim 9, wherein said the wet etching rate of said ozone-TEOS layer on said plasma-enhanced PSG layer is about 2000 to 2500 angstroms/minute.

15. The method of claim 9, wherein the etchant of said wet etching is HF solution.

16. The method of claim 9, wherein said wet etching process further comprising:

performing a plasma etching to remove the remaining said ozone-TEOS layer after performing said wet etching.

* * * * *